United States Patent
Yamaguchi et al.

(10) Patent No.: US 10,896,653 B2
(45) Date of Patent: *Jan. 19, 2021

(54) DISPLAY DEVICE AND ELECTRONIC APPARATUS

(71) Applicant: Japan Display Inc., Tokyo (JP)

(72) Inventors: Hidemasa Yamaguchi, Aichi (JP); Hironao Tanaka, Kanagawa (JP); Daisuke Ito, Kanagawa (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/260,812

(22) Filed: Jan. 29, 2019

(65) Prior Publication Data
US 2019/0156782 A1 May 23, 2019

Related U.S. Application Data

(63) Continuation of application No. 15/434,598, filed on Feb. 16, 2017, now Pat. No. 10,229,645, which is a continuation of application No. 13/740,943, filed on Jan. 14, 2013, now Pat. No. 9,606,381.

(30) Foreign Application Priority Data

Mar. 6, 2012 (JP) ................. 2012-049116

(51) Int. Cl.
*G09G 3/36* (2006.01)
*G02F 1/1335* (2006.01)
(Continued)

(52) U.S. Cl.
CPC ....... *G09G 3/3677* (2013.01); *G02F 1/13306* (2013.01); *G02F 1/133512* (2013.01);
(Continued)

(58) Field of Classification Search
CPC ......... G02F 1/133514; G02F 1/136286; G02F 2201/52; G09G 3/3607; G09G 3/3677;
(Continued)

(56) References Cited

U.S. PATENT DOCUMENTS 6,741,314 B2   5/2004   Song
8,125,603 B2   2/2012   Oh et al.
(Continued)

FOREIGN PATENT DOCUMENTS

CN   101308294 A   11/2008
CN   101424834 A   5/2009
(Continued)

OTHER PUBLICATIONS

Notice of Rejection issued in connection with Japanese application No. 2012-049116, dated Feb. 17, 2015 (7 pages).
(Continued)

*Primary Examiner* — Angela K Davison
(74) *Attorney, Agent, or Firm* — K&L Gates LLP

(57) ABSTRACT

A display device includes: pixels corresponding to respective colors arranged in matrix, wherein each pixel has a pixel circuit portion in which a circuit for display driving of the pixel is arranged and a pixel opening to be an area obtaining effective display light, the pixel openings of the pixels corresponding to at least one color have an area different from areas of the pixel openings of pixels corresponding to other colors.

8 Claims, 14 Drawing Sheets

(51) Int. Cl.
*G02F 1/133* (2006.01)
*G02F 1/1343* (2006.01)
*H01L 27/12* (2006.01)

(52) U.S. Cl.
CPC .. *G02F 1/133514* (2013.01); *G02F 1/134363* (2013.01); *G09G 3/3607* (2013.01); *G09G 3/3655* (2013.01); *G02F 1/134309* (2013.01); *G02F 2201/122* (2013.01); *G02F 2201/52* (2013.01); *G09G 2300/0426* (2013.01); *G09G 2300/0452* (2013.01); *G09G 2300/0465* (2013.01); *G09G 2310/0297* (2013.01); *G09G 2310/08* (2013.01); *G09G 2320/0626* (2013.01); *H01L 27/124* (2013.01)

(58) Field of Classification Search
CPC ......... G09G 3/3655; G09G 2300/0452; G09G 2300/0465; G09G 2300/0426; G09G 2320/0626
See application file for complete search history.

(56) References Cited

U.S. PATENT DOCUMENTS

| 8,502,940 | B2 | 8/2013 | Tanaka et al. |
| 2003/0107694 | A1* | 6/2003 | Song ................ G02F 1/133753 349/129 |
| 2006/0119556 | A1 | 6/2006 | Winters et al. |
| 2009/0109358 | A1 | 4/2009 | Tanaka et al. |
| 2009/0309821 | A1 | 12/2009 | Tanno |
| 2010/0283714 | A1 | 11/2010 | Cho et al. |
| 2012/0188480 | A1 | 7/2012 | Fujii |
| 2012/0206326 | A1 | 8/2012 | Nakamura et al. |
| 2013/0194168 | A1 | 8/2013 | Cho et al. |

FOREIGN PATENT DOCUMENTS

| CN | 101881913 A | 11/2010 |
| CN | 102576165 | 7/2012 |
| CN | 102597859 | 7/2012 |
| JP | 2005-283870 A | 10/2005 |
| JP | 2008-523446 A | 7/2008 |
| JP | 2009-109820 A | 5/2009 |
| JP | 2009-300748 A | 12/2009 |
| JP | 2010-164728 A | 7/2010 |
| WO | 2012/002072 A1 | 1/2012 |

OTHER PUBLICATIONS

Chinese Office Action dated Feb. 26, 2016 in Chinese application No. 201310038437.X (15 pages).
Chinese Office Action dated Oct. 20, 2016 in Chinese application No. 201310038437.x.

* cited by examiner

NUMBER OF PIXELS ((RGB × M) COLUMNS × N ROWS)

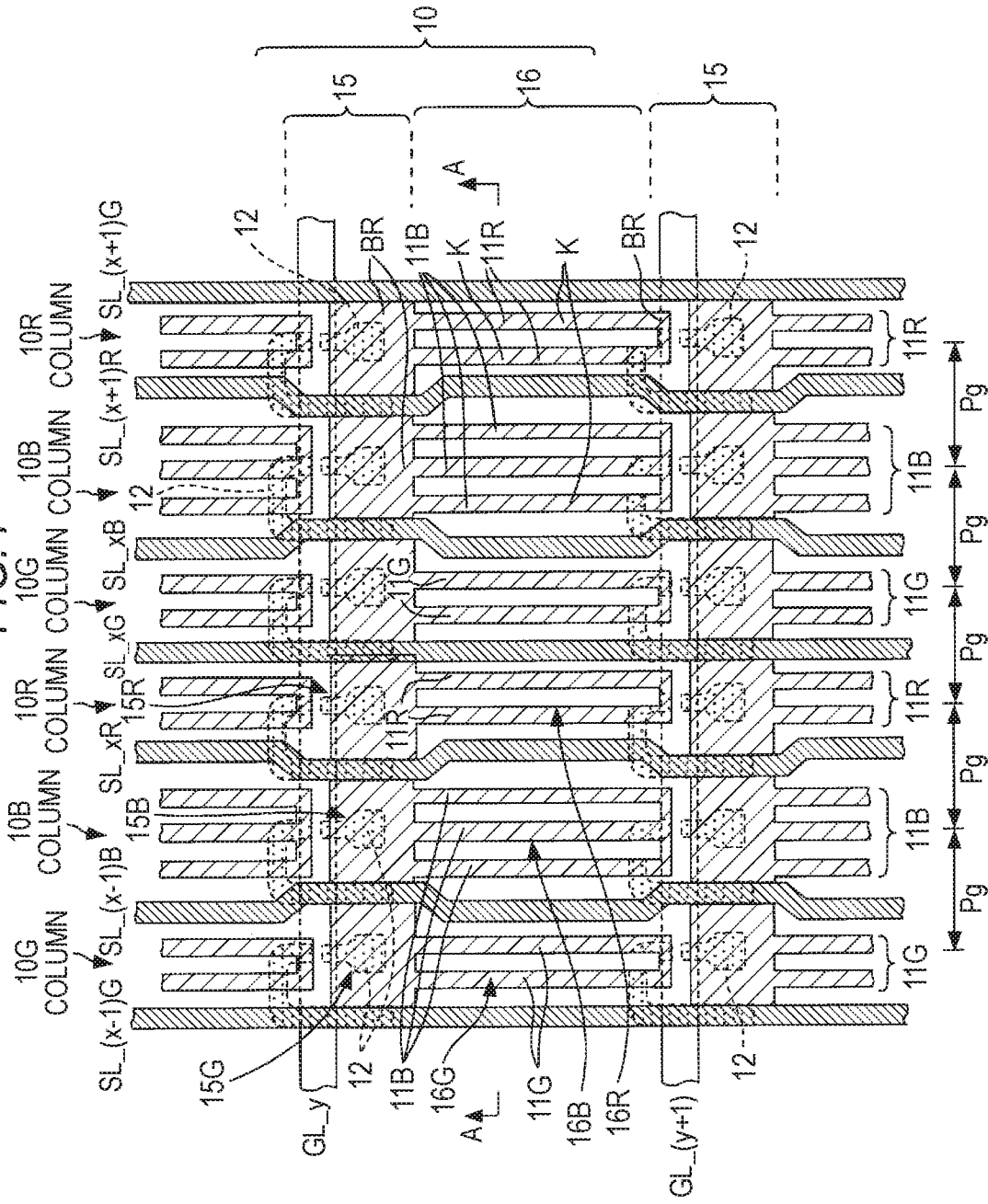

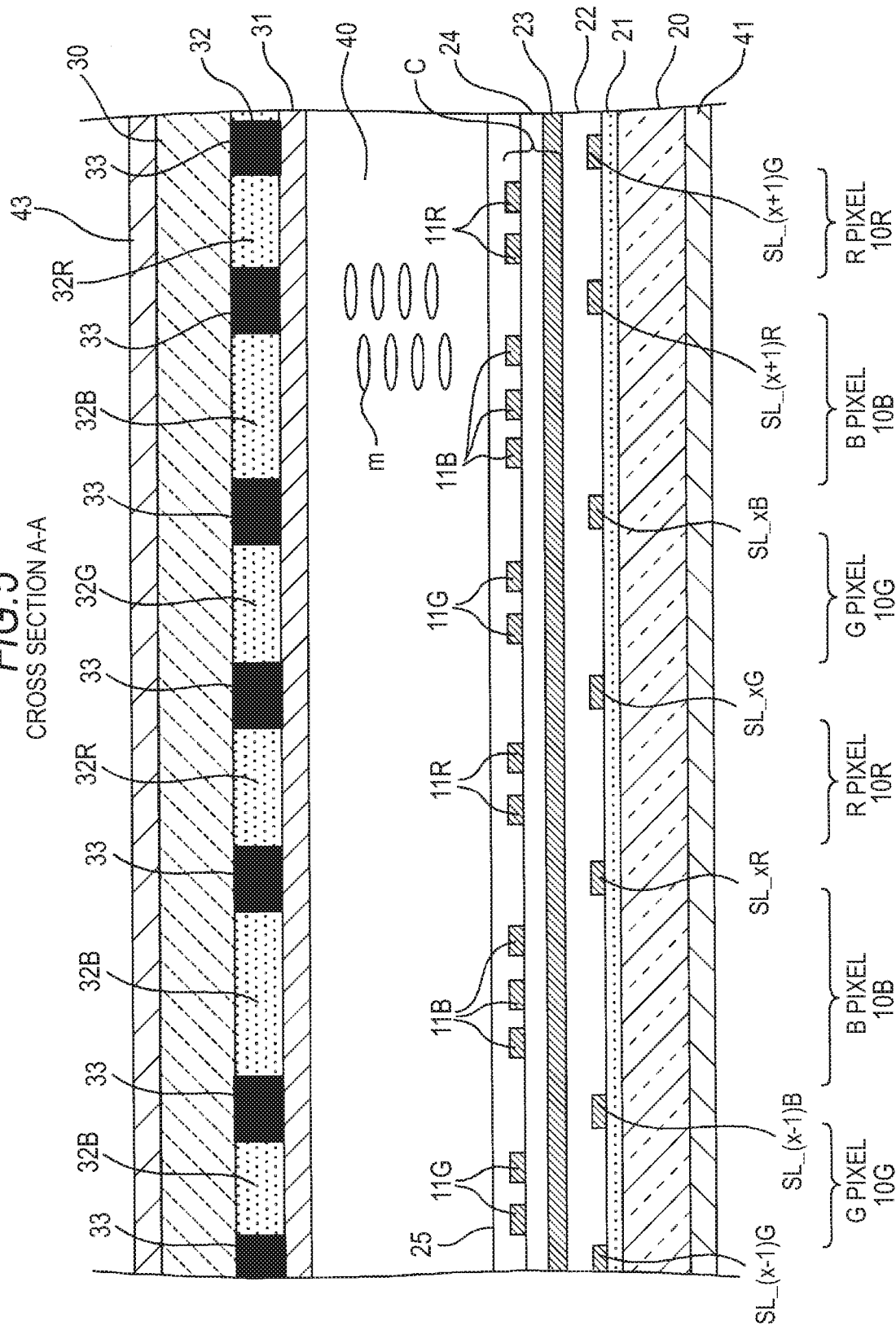

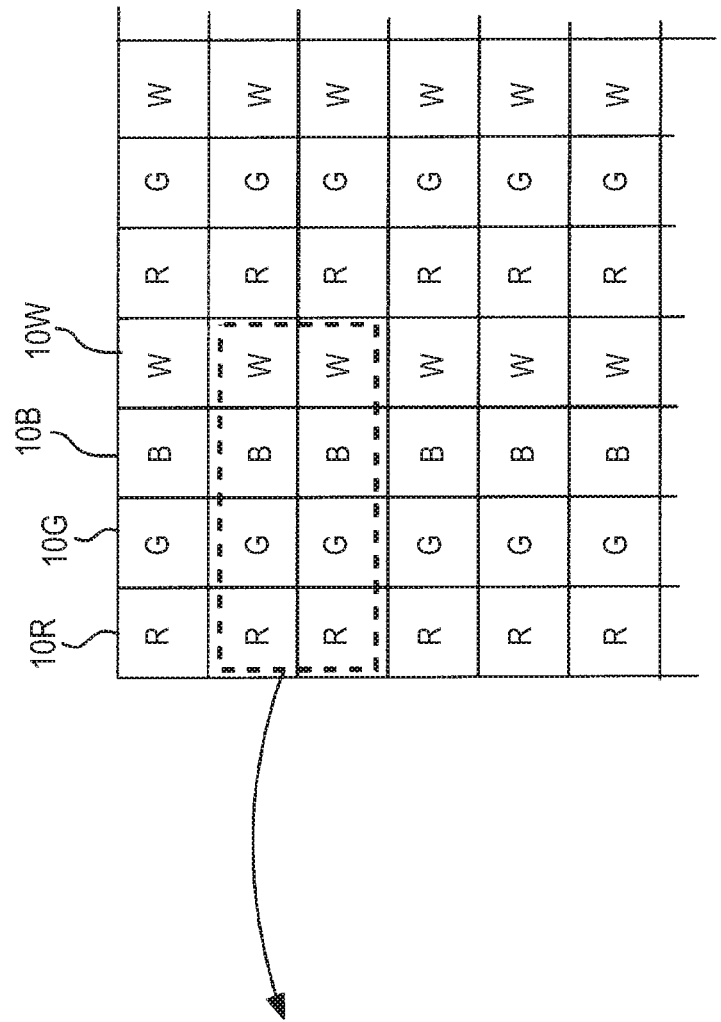
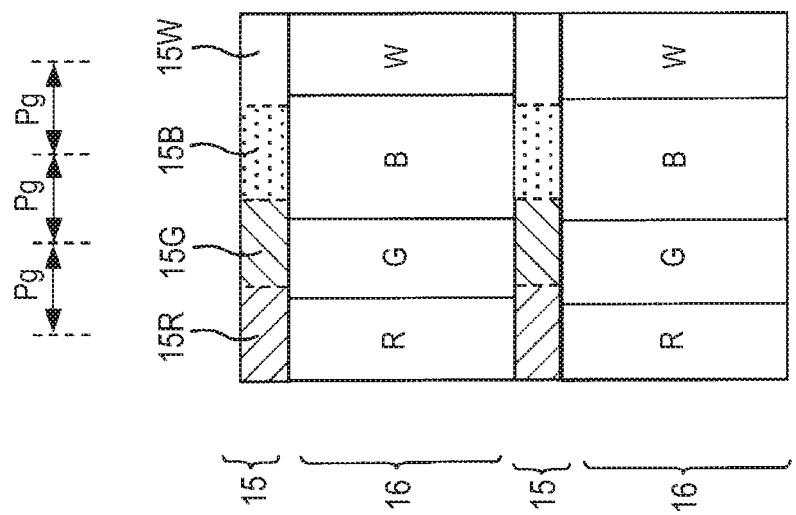

DISPLAY DEVICE AND ELECTRONIC APPARATUS

CROSS-REFERENCE TO RELATED APPLICATIONS

The present application is a continuation of U.S. application Ser. No. 15/434,598, filed Feb. 16, 2017, which is a continuation of U.S. application Ser. No. 13/740,943, filed Jan. 14, 2013, now U.S. Pat. No. 9,606,381, which claims priority to Japanese Application No. 2012-049116, filed Mar. 6, 2012, the disclosures of which are hereby incorporated by reference herein.

BACKGROUND

The present disclosure relates to a display device such as a liquid crystal display device and an electronic apparatus including the display device.

A liquid crystal display device includes sub-pixels of three colors which are red (R), green (G) and blue (B) or four colors by adding white (W) to the above colors, in which white is obtained by additive color mixing of these colors on display. It is necessary to set white balance by changing the brightness of R, G and B respectively for obtaining a desired white.

There are many methods for changing the brightness of respective colors. Normally, the area ratio of pixels of an R-pixel, a G-pixel and a B-pixel is 1:1:1. Accordingly, a method of changing voltages of pixel signals to be given to the R-pixel, the G-pixel and the B-pixel respectively (different voltage values are used even when gray scales are the same) is used. Another common method is to provide a light shielding portion at each pixel to achieve balance between opening areas of pixels.

There is a loss in transmittance which can be originally obtained in the above methods, and a more efficient method is a method of changing the area ratio of the R-pixel, the G-pixel and the B-pixel themselves (deformation of pixels). For example, a structure in which pixel areas vary from color to color is disclosed in JP-A-2009-109820 (Patent Document 1).

SUMMARY

On the other hand, the liquid crystal display device is becoming high definition and commercialization of 500 ppi (pixel per inch)-class display device is close at hand.

In this class of the display device, the minimum pixel pitch, particularly, the pitch in the H-direction (short axis) is determined from layout design rules of transistors and contacts.

However, when the pixels are allowed to vary so as to change the area ratio of pixels of the R-pixel, the G-pixel and the B-pixel as described above, it is difficult to sufficiently secure an arrangement area of a pixel circuit portion such as a transistor in a pixel having a smaller area. Accordingly, it becomes difficult to set white balance by the deformation of the R-pixel, the G-pixel and the B-pixel (area ratio adjustment) in the high-definition display device.

In view of the above, it is desirable to realize deformation of pixels of respective colors even when high definition performance is advanced.

An embodiment of the present disclosure is directed to a display device including pixels corresponding to respective plural colors arranged in matrix, in which each pixel has a pixel circuit portion in which a circuit for display driving of the pixel is arranged and a pixel opening to be an area obtaining effective display light, the pixel openings of the pixels corresponding to at least one color have an area different from areas of the pixel openings of pixels corresponding to other colors, and the pixel circuit portions in respective pixels are arranged at equal pitches.

Another embodiment of the present disclosure is directed to an electronic apparatus including the display device according to the embodiment of the present disclosure.

That is, in the display device according to the embodiment of the present disclosure, the pixel circuit portions having, for example, transistors, contact portions and the like are consistently arranged at equal pitches. Under the condition, the area obtaining effective display light (for example, transmission light) is allowed to differ according to the color. That is, the pixel openings are deformed according to the color under a condition that all the pixel circuit portions are arranged, for example, side by side in the horizontal direction with the same size.

According to the embodiments of the present disclosure, the pixel openings are deformed according to the color and display colors are adjusted by the area ratio of the pixel openings in the event, while the pixel circuit portions are arranged at equal pitches. That is, the area of the pixel circuit portion is the same in the pixel having the smaller area ratio of the pixel opening and in the pixel having a larger area of the pixel opening. Therefore, the pixel in which arrangement of the pixel circuit is difficult is not generated due to the deformation of the pixel opening and white balance adjustment due to the area ratio of the pixel opening can be realized even when the high definition performance is advanced.

Additional features and advantages are described herein, and will be apparent from the following Detailed Description and the figures.

BRIEF DESCRIPTION OF THE FIGURES

FIG. 4 is an explanatory view of a specific pixel structure of a liquid crystal display device according to the first embodiment;

FIG. 5 is an explanatory view of a cross-sectional structure of the liquid crystal display device according to the first embodiment;

FIGS. 11A and 11B are explanatory views for configurations of pixel circuit portions and pixel openings according to a third embodiment;

DETAILED DESCRIPTION

Hereinafter, a liquid crystal display device according to an embodiment will be explained in the following order.
1. Circuit Configuration of Liquid Crystal Display Device
2. Pixel Structure of First Embodiment
3. Pixel Structure of Second Embodiment
4. Pixel Structure of Third Embodiment
5. Modification Examples and Application Examples 1. Circuit Configuration of Liquid Crystal Display Device First, a circuit configuration of a liquid crystal display device according to an embodiment will be explained with reference to FIG. 1.

Figure 1:
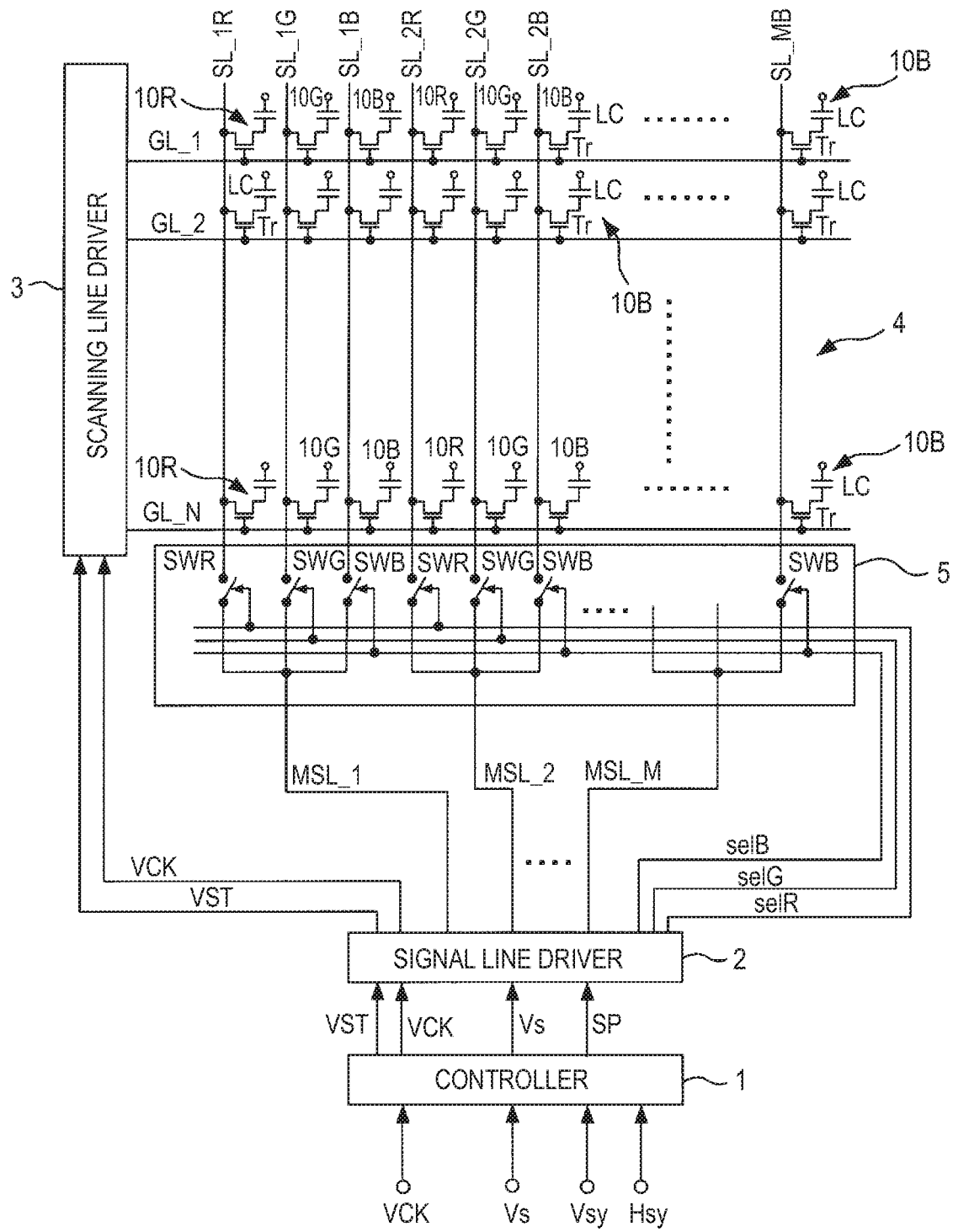
FIG. 1 is a block diagram of a liquid crystal display device according to an embodiment of the present disclosure.

The liquid crystal display device is an example of an active-matrix type display device, including a controller 1, a signal line driver 2, a scanning line driver 3, a pixel array 4 and a selection switch unit 5 as shown in FIG. 1.

The pixel array 4 is configured so that plural pixels 10 (10R, 10G and 10B) display gray scales of which are controlled according to written pixel signals are arranged in a row direction and a column direction in a matrix state. N×(M×3) pieces of pixels 10 are arranged, which form a matrix of N rows and (M×3) columns.

In the drawing, each of pixels 10 (10R, 10G, 10B) is shown by a pixel transistor Tr and a liquid crystal cell capacitor LC. Various examples can be cited as circuits forming liquid crystal pixels. The circuit shown here is a schematic example for explanation.

The pixel 10R represents an R (red) pixel, the pixel 10G represents a G (green) pixel and the pixel 10B represents a B (blue) pixel. The pixel 10R, 10G and 10B are so-called sub-pixels and these three sub-pixels form one color pixel.

Not-shown respective color filters of R, G and B are arranged so as to correspond to the R-pixel, the G-pixel and the B-pixel. A color display screen is formed by R-pixels, G-pixels and B-pixels being arranged, for example, as shown in the drawing.

The pixel is configured by three primary colors of the R-pixel, the G-pixel and the B-pixel in this case, however, there may be a case where, for example, a W (white)-pixel is provided in addition to the R-pixel, G-pixel and B-pixel.

In the following description, pixels are represented as "pixels 10" when it is not necessary to particularly distinguish sub-pixels one another.

Each pixel 10 includes, a pixel transistor Tr (for example, an N-channel TFT) formed by, for example, a TFT (thin-film transistor) and the liquid crystal cell capacitor LC.

In the pixel transistor Tr, a gate electrode (control terminal) is connected to a scanning line GL (any of GL_1 to GL_N) and one of a source electrode/drain electrode (input terminal) is connected to a signal line SL (any of SL_1R to SL_MB).

A pixel electrode of the liquid crystal cell capacitor LC is connected to the other of the source electrode/drain electrode (output terminal) of the pixel transistor Tr. The other electrode of the liquid crystal cell capacitor LC is a common electrode.

In each pixel 10, the pixel transistor Tr becomes conductive when a scanning pulse is applied to any of scanning lines GL (GL_1 to GL_N) and a pixel signal voltage (gray scale value) given to the signal line SL at that time is inputted.

The transmittance of the liquid crystal cell capacitor LC is controlled in accordance with the written pixel signal voltage, and display luminance of light from a not-shown backlight is controlled.

The scanning lines GL (GL_1 to GL_N) are arranged so as to correspond to the pixels 10 of respective lines in the pixel array 4.

The scanning line driver 3 sequentially drives respective scanning lines GL_1 to GL_N in one frame period. That is, the scanning line driver 3 sequentially applies the scanning pulse.

The signal lines SL (SL_1R, SL_1G, SL_1B, SL_2R . . . SL_MB) are arranged so as to correspond to the pixels 10 in respective columns.

The signal lines SL_1R and SL_2R . . . supply the pixel signal to pixel columns of R-pixels 10R.

The signal lines SL_1G and SL_2G . . . supply the pixel signal to pixel columns of G-pixels 10G.

The signal lines SL_1B and SL_2B . . . supply the pixel signal to pixel columns of B-pixels 10B.

The signal driver 2 outputs pixel signals with respect to respective pixels 10 to plural signal lines SL arranged in the pixel array 4 in every one line period with a polarity in accordance with a polarity signal SP.

A video signal Vs, a vertical clock VCK, a vertical synchronization signal Vsy and a horizontal synchronization signal Hsy are supplied to the controller 1.

The controller 1 controls the signal line driver 2 and the vertical line driver 3 based on the vertical clock VCK, the vertical synchronization signal Vsy and the horizontal synchronization signal Hsy for executing display of the video signal Vs supplied from the outside in the pixel array 4 so that these signals operate in synchronization with one another.

For example, the controller 1 generates a vertical start pulse VST prescribing one frame period by using, for example, the vertical synchronization signal Vsy and the vertical clock VCK, supplying the signals to the signal line driver 2 and the scanning line driver 3.

The controller 1 also generates the polarity signal SP by dividing, for example, the vertical clock VCK and supplies the signal to the signal line driver 2.

The scanning line driver 3 outputs the scanning pulse to respective scanning lines GL_1 to GL_N based on the vertical start pulse VST and the vertical clock VCK.

In the scanning line driver 3, a shift register which sequentially transfers the vertical start pulse VST at the timing of the vertical clock VCK is provided. Accordingly, the scanning pulse is sequentially outputted to the scanning lines GL_1, GL_2 . . . GL_N by setting the timing of the vertical start pulse as a starting point. Accordingly, pixels 10 in the first line to the pixels in the N-th line sequentially become in a selected state for writing pixel signals in each timing of the vertical clock VCK in the pixel array 4.

The signal line driver 2 performs operation of outputting pixel signals in units of lines concerning the video signal Vs supplied from the controller 1 to respective signal lines SL_1R to SL_MB at each timing of the vertical clock VCK (in each 1H period) by setting the timing of the vertical start pulse VST as a starting point.

Here, the selection switch unit 5 is provided in the configuration example.

The signal line driver 2 outputs the pixel signal which has been time-division multiplexed in units of color pixels to each of multiplexed signal lines MSL (MSL_1 to MSL_M).

In the selection switch unit 5, switches SWR, SWG and SWB for selecting respective three signal lines SL are included with respect to one multiplexed signal line MSL.

The switch SWR connects/disconnects a signal line SL_xR corresponding to a column of the R-pixel 10R to/from a multiplexed signal line MSL (x corresponds to 1 to M).

The switch SWG connects/disconnects a signal line SL_xG corresponding to a column of the G-pixel 10G to/from the multiplexed signal line MSL.

The switch SWB connects/disconnects a signal line SL_xB corresponding to a column of the B-pixel 10B to/from the multiplexed signal line MSL.

The respective switches SWR, SWG and SWB are turned on/off according to switch control signals selR, selG and selB from the signal line driver 2 respectively.

The signal line driver 2 outputs the switch control signals selR, selG and selB so as to correspond to the timing of outputting the multiplexed pixel signal to the multiplexed signal lines MSL.

The signal line driver 2 outputs the pixel signals with respect to respective R-pixel 10R, the G-pixel 10G and the B-pixel 10B to which time-division multiplexing is performed to one multiplexed signal line MSL in the 1H period. Additionally, the signal line driver 2 controls the switches SWR, SWG and SWB to supply respective pixel signals to the signal lines SL_xR, SL_xG and SL_xB.

The signal line driver 2 performs polarity inversion of a pixel signal voltage to be outputted to the multiplexed signal line MSL in accordance with the polarity signal SP for performing polarity inversion driving of the liquid crystal cell capacitor LC.

According to the above operations of the signal line driver 2 and the scanning line driver 3, the pixel signals are sequentially written from the pixels 10 in the first line to the pixels in the N-th line in one frame period, thereby setting gray scales (light transmittance of the liquid crystal cell) of respective pixels. As a result, color video display is executed by luminance of light from the not-shown backlight being controlled in respective pixels 10 as well as light is transmitted through not-shown color filters.

2. Pixel Structure of First Embodiment

In the liquid crystal display device according to the embodiment, pixels corresponding to respective plural colors (R, G and B) are arranged in matrix in the pixel array 4 as described above.

The structure of the pixels will be explained as the first embodiment.

Though the pixel transistor Tr is shown in the pixel 10 in FIG. 1, the pixel 10 includes, in an actual pixel structure, a pixel circuit portion in which the pixel transistor Tr and so on are arranged and a pixel opening to be an area for obtaining effective display light (for example, transmission light) as areas seen from a panel plane.

As described above, it is necessary to set the while balance by changing the brightness of R, G and B in order to obtain desired white in the display. As an efficient method without transmittance loss for the above purpose, it is preferable to change the pixel area according to the color. However, when the pixel size is reduced with the advance of high definition, the arrangement of the pixel circuit will be difficult particularly in a pixel in which the area thereof is reduced to be smaller than other pixels due to deformation of pixels.

Figure 2A:
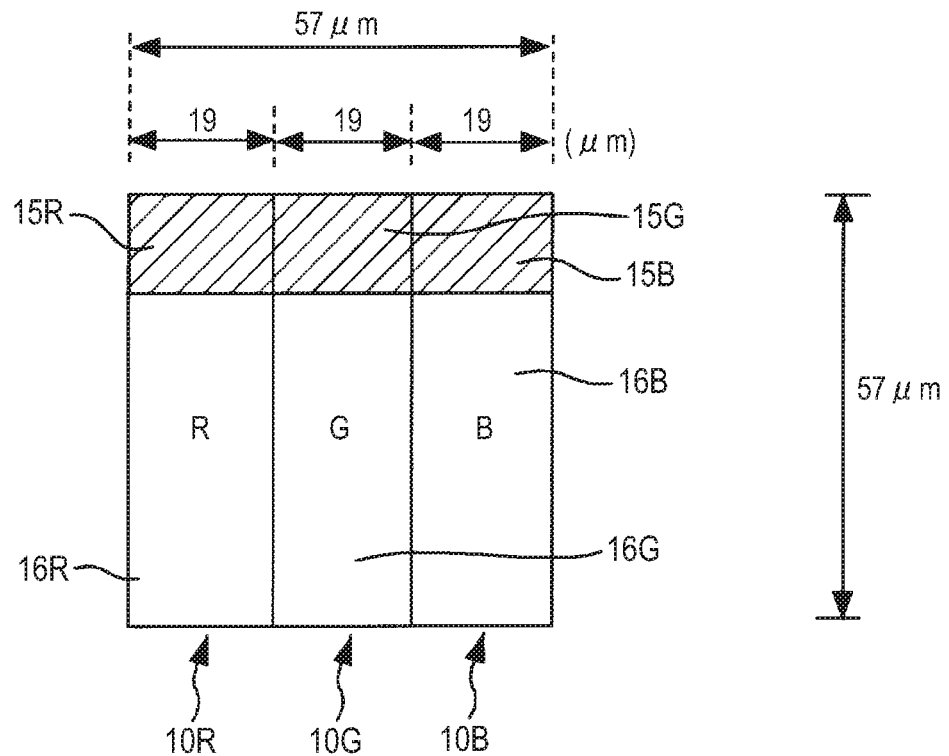
FIGS. 2A and 2B are explanatory views concerning difficulty of deformation of pixels due to the advance of high definition performance.

This will be explained with reference to FIGS. 2A and 2B. FIG. 2A schematically shows a case in which the R-pixel 10R, the G-pixel 10G and the B-pixel 10B have the same area.

In each pixel 10, there exists a pixel opening 16 (16R, 16G and 16B) to be an area through which display light is actually transmitted, and there also exists a pixel circuit portion 15 (15R, 15G and 15B) in which the pixel transistor Tr, the signal line SL, a contact portion with respect to the pixel electrode and the like are arranged.

Here, assume that the size of one pixel (=three sub-pixels) is 57 μm×57 μm as an example, the width of one pixel 10 (sub-pixel) in the horizontal direction will be 19 μm.

In the pixel circuit portion 15, the minimum pixel pitch in the horizontal direction (short axis) is determined from layout design rules of transistors and contacts. For example, the pitch is approximately 18 μm. In this case, when the width of one pixel 10 in the horizontal direction is 19 μm as shown in FIG. 2A, the layout of the pixel circuit portions 15 is possible.

Figure 2B:
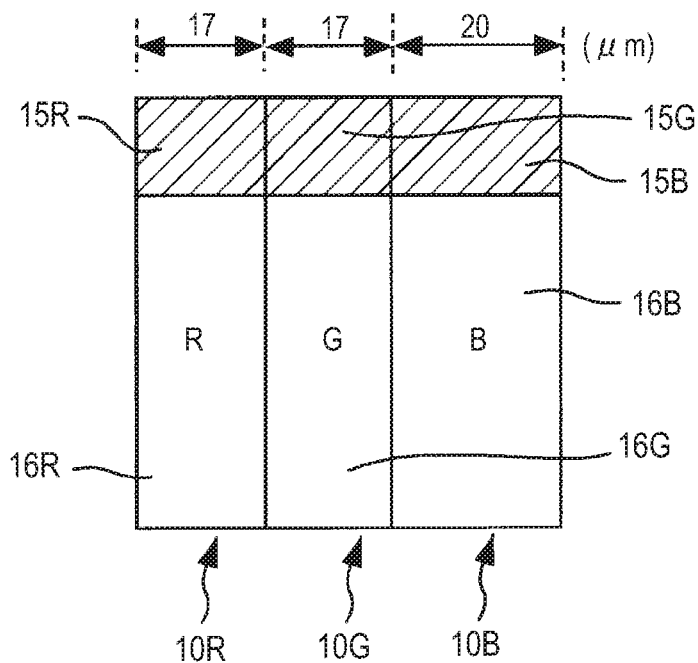

FIG. 2B shows an example in which the pixels are deformed according to the color. The area of the B-pixel 10B is enlarged. For example, as the width in the horizontal direction, the R-pixel 10R is set to 17 μm, the G-pixel 10G is set to 17 μm and the B-pixel 10B is set to 20 μm.

In this case, the widths of the pixel circuit portions 15R, 15G and 15B are also set to 17 μm, 17 μm and 20 μm respectively. Then, the widths of the pixel circuit portions 15R and 15G are narrower than the minimum pitch, therefore, the circuit layout design becomes difficult.

That is, as high definition performance is advanced, it is difficult to set white balance by deforming pixels for convenience of the pixel circuit arrangement.

In response to this, pixels can be deformed even when the high definition performance is advanced in the present embodiment. For this purpose, the pixel openings 16 are deformed according to the color. That is, the pixel openings 16 of the pixels 10 corresponding to at least one color have a different area from areas of the pixel openings 16 of the pixels 10 corresponding to other colors. Then, the pixel circuit portions 15 in respective pixels 10 are arranged at equal pitches.

Figure 3B:
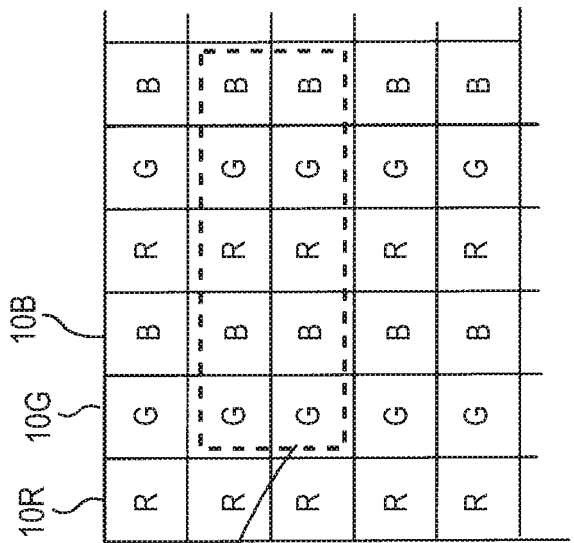
FIGS. 3A and 3B are explanatory views for configurations of pixel circuit portions and pixel openings according to a first embodiment.
Figure 3A:
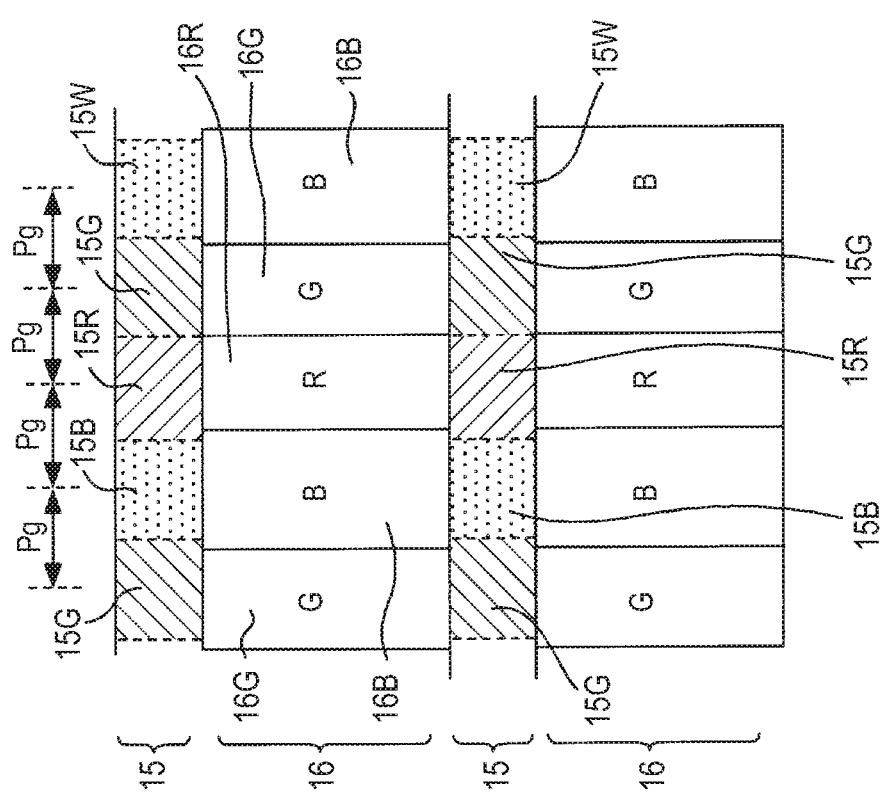

The above is schematically shown in FIGS. 3A and 3B.

FIG. 3B shows the R-pixels 10R, the G-pixels 10G and the B-pixels 10B arranged in matrix as shown in FIG. 1. A portion surrounded by dotted lines in FIG. 3B is shown in an enlarged state in FIG. 3A.

The R-pixel 10R includes the pixel opening 16R and the pixel circuit portion 15R.

The G-pixel 10G includes the pixel opening 16G and the pixel circuit portion 15G.

The B-pixel 10B includes the pixel opening 16B and the pixel circuit portion 15B.

In this case, for example, the pixel openings 16B of the B-pixels 10B are deformed so as to have a larger area than areas of the pixel openings 16R and 16G of the R-pixels 10R and the G-pixels 10G.

However, concerning the pixel circuit portions 15, the pixel circuit portions 15R, 15G and 15B are arranged at equal pitches Pg.

Assume that the width of the pixel opening portion 16B in the horizontal direction is 20 μm and the width of the pixel openings 16R and 16G in the horizontal direction is 17 μm in the same manner as an example of FIG. 2B. In this case, the arrangement pitch Pg of the pixel circuit portions 15R, 15G and 15B will be 18 μm. That is, layout of the pixel circuits is possible in this pitch.

As described above, the pixel openings 16 of the pixels 10 corresponding to at least one color have a different area from areas of the pixel openings 16 of the pixels 10 corresponding to other colors, and the pixel circuit portions 15 of respective pixels 10 are arranged at equal pitches. According to the structure, color balance can be adjusted by deforming pixels in a state where the pixel circuit layout is possible even when high definition performance is advanced.

Hereinafter, a specific example as the first embodiment will be explained.

The following example particularly explains a structure of a display device in which liquid crystal molecules are driven in a fringe field switching (FFS) mode.

A lateral-electric field mode in the liquid crystal display devices attracts attention as a liquid crystal mode for realizing a wide viewing angle and high contrast. Particularly in this mode, the open area ratio and transmittance have been improved in the fringe field switching (FFS) mode as compared with an In-Plane-Switching (IPS) mode.

FIG. 4 shows a portion of part of the pixel 10 in the pixel array 4 shown in FIG. 1. Columns of R-pixels 10R, columns of G-pixels 10G and columns of B-pixels 10B are formed in areas where scanning lines GL_y and GL_(y+1) intersect with signal lines SL_(x−1)G to SL_(x+1)G. ("x" is 1<x<M, "y" is 1≤y<N (refer to FIG. 1 concerning M, N).

FIG. 5 schematically shows a structure of a cross section A-A of FIG. 4.

Figure 6:
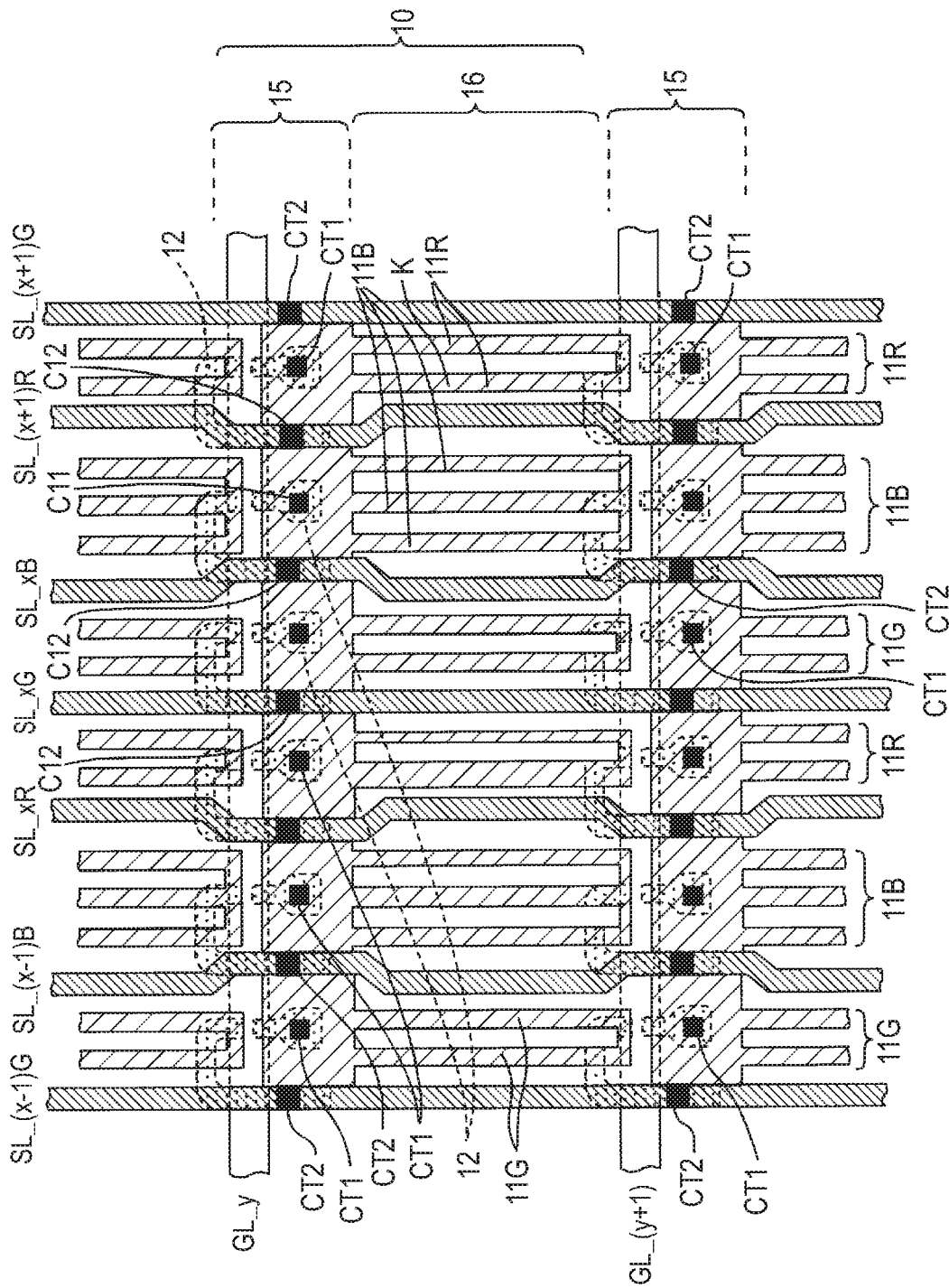
FIG. 6 is an explanatory view clearly showing contact portions in the pixel structure of FIG. 4 according to the first embodiment.

FIG. 6 clearly shows contact holes CT1 and CT2 in the structure of FIG. 4.

Figure 7:
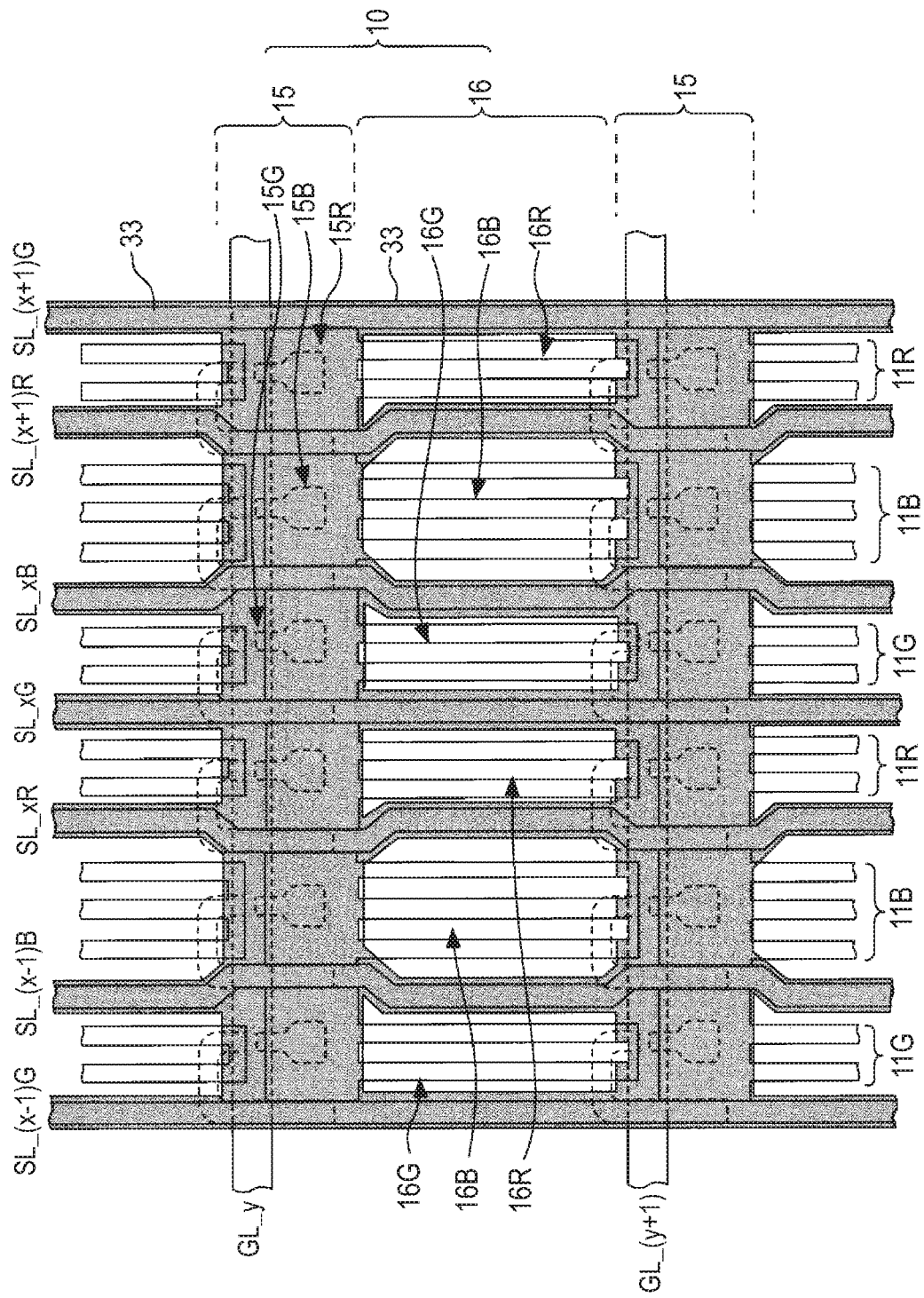
FIG. 7 is an explanatory view showing the structure of FIG. 4 to which a shielding film is added according to the first embodiment.

FIG. 7 shows a shielding film 33 (black matrix) which is superimposed on the structure of FIG. 4.

Figure 8:
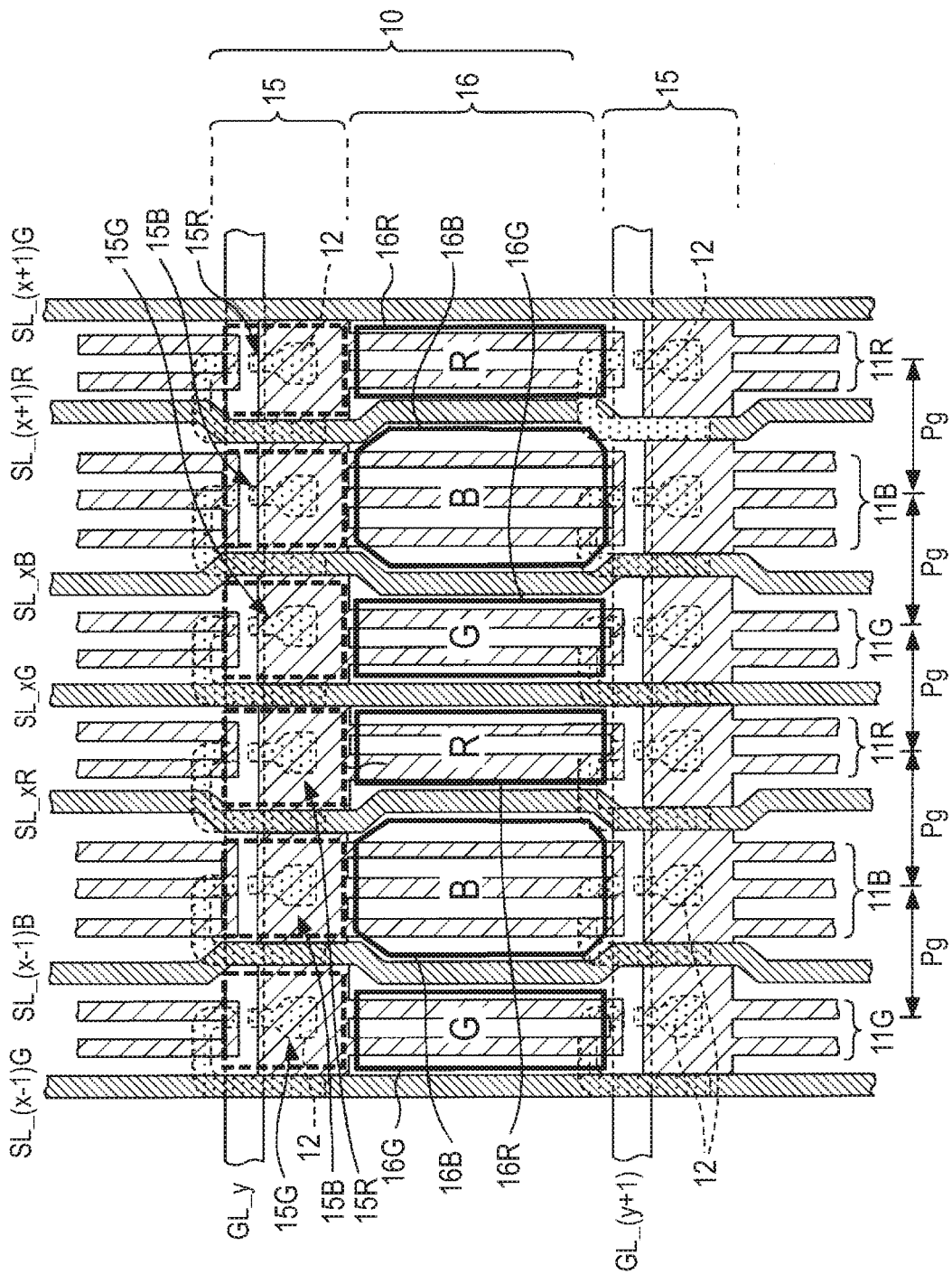
FIG. 8 is an explanatory view clearly showing pixel openings of R, G and B pixels in the pixel structure of FIG. 4 according to the first embodiment.

FIG. 8 clearly shows the pixel openings 16R, 16G and 16B and the pixel circuit portions 15R, 15G and 15B in the structure of FIG. 4.

The pixel structure of the embodiment will be explained with reference to these drawings appropriately.

As shown in FIG. 4, the pixels 10R, 10G and 10B are formed with respect to wiring lines of the signal lines SL (SL_(x−1)G to SL_(x+1)G and the gate lines GL (GL_y and GL_(y+1)).

As the pixels 10R, 10G and 10B, the pixel electrodes 11 (11R, 11G and 11B) and electrode patterns 12 each including the pixel transistor Tr are shown in the drawing.

The pixel openings 16 (16R, 16G and 16B) in the pixels 10 are areas where pixel electrodes 11 and slits between the pixel electrodes appear as shown by being surrounded by heavy lines in FIG. 8.

On the other hand, the pixel circuit portions 15R, 15G and 15B in the pixels 10 are areas where the pixel transistor Tr (the electrode pattern 12 and the scanning line GL) and a bridge portion BR of the pixel electrode 11 are respectively provided. That is, these areas are shown by being surrounded by heavy dotted lines in FIG. 8. The pixel circuit portions 15R, 15G and 15B are covered with the shielding film 33 (areas shown in gray) as shown in FIG. 7.

The structure of the pixel opening 16 will be explained with reference to FIG. 4 and FIG. 5.

As shown in FIG. 5, the liquid crystal display device has a structure in which a liquid crystal layer 40 is provided between a first substrate 20 having light permeability with respect to visible light and a second substrate 30.

A gate insulating film 21 is provided on the first substrate 20. The scanning lines GL shown in FIG. 4 are arranged in the horizontal direction so as to be covered by the gate insulting film 21, though not shown in the cross section A-A of FIG. 5. The electrode patterns 12 made of Po—Si shown in FIG. 4 are formed over the scanning lines GL through a semiconductor film (not shown in FIG. 4). The pixel transistor Tr shown in FIG. 1 is formed by using the electrode pattern 12 as the source/drain and using the scanning line GL as the gate.

As shown in the cross section A-A of FIG. 5, plural signal lines SL (SL_(x−1)G to SL_(x+1)G) are arranged in the vertical direction intersecting with the scanning lines GL on the gate insulating film 21. The pixels 10 are formed at respective intersections of these scanning lines GL and the signal lines SL.

A first insulating film 22 is provided on the gate insulating film 21 as a first layer of an interlayer insulating film in a state of covering the pixel transistors Tr and the signal lines SL. The first insulating film 22 has a film thickness in which insulation performance between the signal lines SL and the source electrodes/the drain electrodes of the pixel transistor Tr in a lower layer and an upper layer can be positively secured.

A common electrode 23 made of a transparent conductive material (for example, ITO, IZO and so on) is provided on the first insulating film 22 as a solid film so as to be common to respective pixels.

A second insulating film 24 is further provided on the common electrode 23 as a second layer of the interlayer insulating film. The second insulating film 24 is formed in a thin-film state in which film-thickness uniformity is secured for obtaining driving characteristics of liquid crystal molecules "m" included in the liquid crystal layer 40.

The pixel electrodes 11R, 11G and 11B are provided so as to correspond to respective pixels 10R, 10G and 10B on the second insulating film 24. Accordingly, capacitor devices C are provided between the common electrode 23 and the pixel electrodes 11R, 11G and 11B so as to sandwich the second insulating film 24 as a dielectric in respective pixels 10R, 10G and 10B.

Here, as can be seen from FIG. 4, the pixel electrodes 11R, 11G and 11B are formed in a so-called comb-teeth electrode shape, each having plural comb-teeth portions K extending along the signal line SL in parallel and the bridge portion BR connecting respective comb-teeth portions K by both end portions.

In the present embodiment, for example, the pixel electrodes 11R and 11G of the R-pixel 10R and the G-pixel 10G have two comb-teeth portions K respectively, and the B-pixel 10B has three comb-teeth portions K. That is, two pixel electrodes 11R and 11G are arranged in the pixel openings 16R and 16G, and three electrodes 11B are arranged in the pixel opening 16B.

The pixel electrodes 11R, 11G and 11B are made of a transparent conductive material (for example, ITO, IZO and so on). Respective electrodes are connected to the electrode patterns 12 (drain electrodes) forming the pixel transistors Tr through the contact holes CT2 shown in FIG. 6.

The electrode patterns 12 (source electrode side) forming the pixel transistors Tr are connected to the signal lines SL through the contact holes CT2 shown in FIG. 6.

Accordingly, the pixel transistors Tr are selected by the scanning pulse to be inputted to the scanning lines GL, and the pixel signal written from the signal line SL through the selected pixel transistors Tr is supplied to the pixel electrodes 11 to be held in the capacitor devices C existing between the common electrode 23 and the pixel electrodes 11.

An alignment film 25 is provided above the first substrate 20 over which the pixel electrodes 11 are provided as shown in FIG. 5, thereby forming an upper part of the first substrate 20 on the driving side.

The second substrate 30 is arranged opposite to the first substrate 20. The second substrate 30 is made of a light transmissive material, and a color filter layer 32 is formed on a surface facing the pixel electrodes 11.

In the color filter layer 32, red filters 32R are formed at positions corresponding to the R-pixels 10R, green filters 32G are formed at positions corresponding to the G-pixels 10G and blue filters 32B are formed at positions corresponding to the B-pixels 10B.

The shielding film 33 is formed at positions corresponding to the signal lines SL and the pixel circuit portions 15. The shielding film 33 is formed as the black matrix so as to shield portions other than the pixel openings 16R, 16G and 16B (portions not contributed to the display) from light as shown in FIG. 7.

In the case of forming the black matrix in this manner, areas as the pixel openings 16R, 16G and 16B for obtaining effective display light are finally determined depending on a pattern of the black matrix. However, in the present embodiment, the black matrix shields portions corresponding to the signal lines SL and the pixel circuit portions 15 as shown in FIG. 7, not shielding the entire areas of the pixel openings 16R, 16G and 16B. That is, the areas of the pixel openings 16 approximately correspond to areas where the shielding film 33 is not formed.

Accordingly, the intensity of transmission light is not adjusted according to R, G and B by the black matrix, and the intensity of transmission light is not lost.

An alignment film 31 is provided on the color filter layer 32 in which the color filters 32R, 32G and 32B of respective colors and the shielding film 33 described above are provided as shown in FIG. 5. Then, the liquid crystal layer 40 is provided between the alignment film 25 of the first substrate 20 and the alignment film 31 of the second substrate 30.

Polarizing plates 41 and 43 are arranged at the outside of the first substrate 20 and the second substrate 30. A not-shown backlight is arranged at the outside of the polarizing plate 41 on the first substrate 20 side.

An optical configuration in the liquid crystal display device can be the same as a common FFS-mode liquid crystal display device.

In the liquid crystal display device, the pixel transistors Tr are selected by the scanning pulse to be inputted to the scanning line GL, and the pixel signal written from the signal line SL through the selected pixel transistors Tr is held in the capacitor devices C between the common electrode 23 and the pixel electrodes 11 as well as supplied to the pixel electrodes 11. Accordingly, a potential difference is given between the common electrode 23 and the pixel electrodes 11, an electric field parallel to the first substrate 20 is generated and liquid crystal molecules "m" are driven, thereby performing optical modulation.

In the first embodiment described above, concerning the pixel openings 16 of respective pixels 10, the pixel openings 16B of the B-pixels 10B is deformed and have a larger area than areas of the pixel openings 16R and 16G of the R-pixels 10R and the G-pixels 10G as shown in FIG. 8.

On the other hand, concerning the pixel circuit portions 15 of respective pixels 10, the pixel circuit portions 15R, 15G and 15B of respective pixels 10R, 10G and 10B arranged in the same row are arranged side by side in the row direction. The pixel circuit portions 15R, 15G and 15B are arranged with the same area at equal pitch Pg.

In order to realize the above arrangement, part of the signal lines SL is bent.

That is, in the range shown in FIG. 4, FIG. 6, FIG. 7 and FIG. 8, the signal lines SL_(x−1)G, SL_xG and SL_(x+1)G with respect to the G-pixels 10G are straight signal lines which are not bent.

On the other hand, the signal lines SL_(x−1)B and SL_xB with respect to the B-pixels 10B are bent so as to extend the left side of the pixel openings 16B of the B-pixels 10B.

The signal lines SL_xR and SL (x+1)R with respect to the R-pixels 10R are bent so as to extend the right side of the pixel openings 16B of the B-pixels 10B.

All signal lines SL are arranged at equal intervals when attention is paid to the pixel circuit portions 15.

As part of the signal lines SL is bent so as to extend the area of the pixel openings 16B of the B-pixels 10B as described above, the pixel openings 16B are deformed as compared with the pixel openings 16R and 16G, and yet, the pixel circuit portions 15R, 15G and 15B are arranged with the same area at equal pitches.

According to the above structure, the pixels can be deformed even when high definition performance is advanced. That is, desired white balance can be obtained by varying the area of the pixel openings 16R, 16G and 16B. If the pixel openings 16R, 16G and 16B are formed to be different, the pixel circuit portions 15R, 15G and 15B are arranged with the same size at equal pitches Pg. Accordingly, for example, even when the widths of the pixel openings 16R and 16G in the horizontal direction are narrowed, the widths of the pixel circuit portions 15R and 15G are not narrowed, therefore, the circuit layout design is not complicated.

Accordingly, the white balance can be obtained by changing the pixel size (the area ratio of the pixel openings) in response to the advance of high definition. As a result, the adjustment of white balance without a loss of light intensity can be realized.

Additionally, the pixel circuit portions 15 of respective pixels 10 arranged in the same row are arranged side by side in the row direction, which makes the formation of a pattern of bending the signal lines SL easier.

Furthermore, two pixel electrodes 11 are arranged in the pixel openings 16R and 16G and three pixel electrodes 11 are arranged in the pixel opening 16B in the present embodiment as described above. Also according to the structure, suitable driving of liquid crystal can be realized with respect to respective pixels having different areas.

3. Pixel Structure of Second Embodiment

A second embodiment will be explained. The second embodiment is obtained by applying the technology of the present disclosure to an example of thinning out B-pixels and W-pixels in the case where pixels of four colors R, G, B and W are included.

Figure 9B:
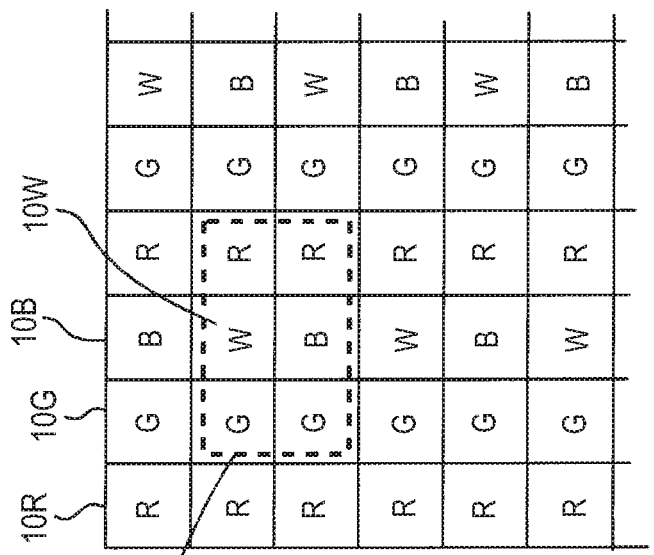
FIGS. 9A and 9B are explanatory views for configurations of pixel circuit portions and pixel openings according to a second embodiment.

FIG. 9B shows an example in which respective pixels 10 arranged in matrix as shown in FIG. 1 include W-pixels 10W.

The R-pixels 10R and the G-pixels 10G are arranged so as to be aligned in the column direction (vertical direction). The B-pixels 10B and the W-pixels 10W are alternately arranged in the same column. That is, the number of the B-pixels 10B and the number of the W-pixel 10W are lower than the number of the R-pixels 10R and the number of the G-pixels 10G (thinned out).

Figure 9A:
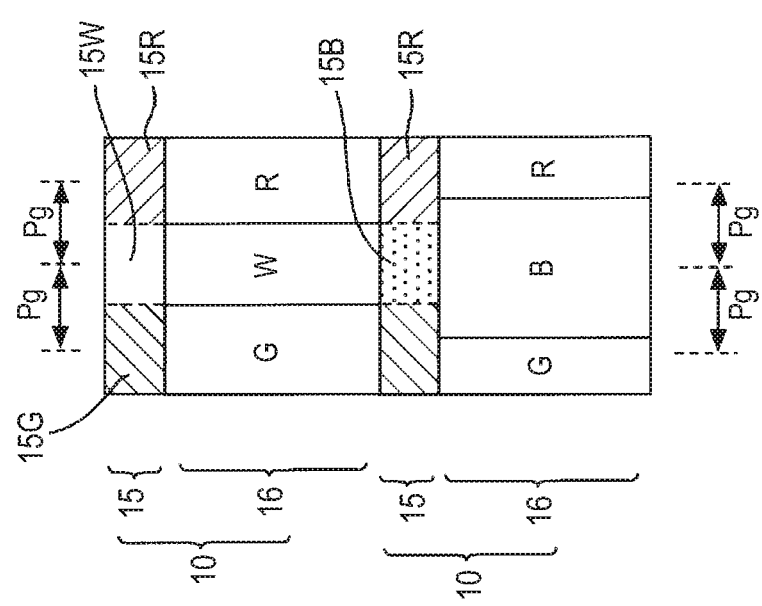

A portion surrounded by dotted lines of FIG. 9B is enlarged to be shown in FIG. 9A.

All the R-pixel 10R, the G-pixel 10G, the B-pixel 10B and the W-pixel 10W include the pixel openings 16 (16R, 16G, 16B, 16W) and the pixel circuit portions 15 (15R, 15G, 15B and 15W).

In this case, for example, the pixel opening 16B of the B-pixel 10B is deformed to have a larger area than areas of the pixel openings 16R, 16G and 16W of the R-pixel 10R, the G-pixel 10G and the W-pixel 10W.

Concerning the pixel circuit portions 15, the pixel circuit portions 15R, 15G, 15B and 15W of respective colors are arranged at equal pitches Pg.

According to the above structure, the white balance can be obtained by deformation of the pixel openings 16B in the same manner as the case of the first embodiment, which can respond to the case of high definition.

Particularly, in the structure of thinning out the B-pixels 10B and the W-pixels 10W, the area ratio of blue is smaller than red and green. Accordingly, it is necessary to deform the pixels so as to increase the area difference, and the minimum pixel width in units of sub-pixels becomes narrower. Therefore, it is extremely effective that the pixel openings 16B of the B-pixels 10B are widened while setting the pixel circuit portions 15 at equal pitches as in the present embodiment.

Moreover, when pixels are deformed merely in units of columns, that is, when the area of the pixel openings 16W of the W-pixels 10 is also widened in the same manner as the pixel opening 16B, the area of white is increased too much and the total area of red, green and blue is reduced too much. As the area of the pixel openings 16W of the W-pixels 10 is not widened in the case of the present embodiment, such problems do not occur, and the design of deformation in consideration of color balance can be easily realized.

Figure 10:
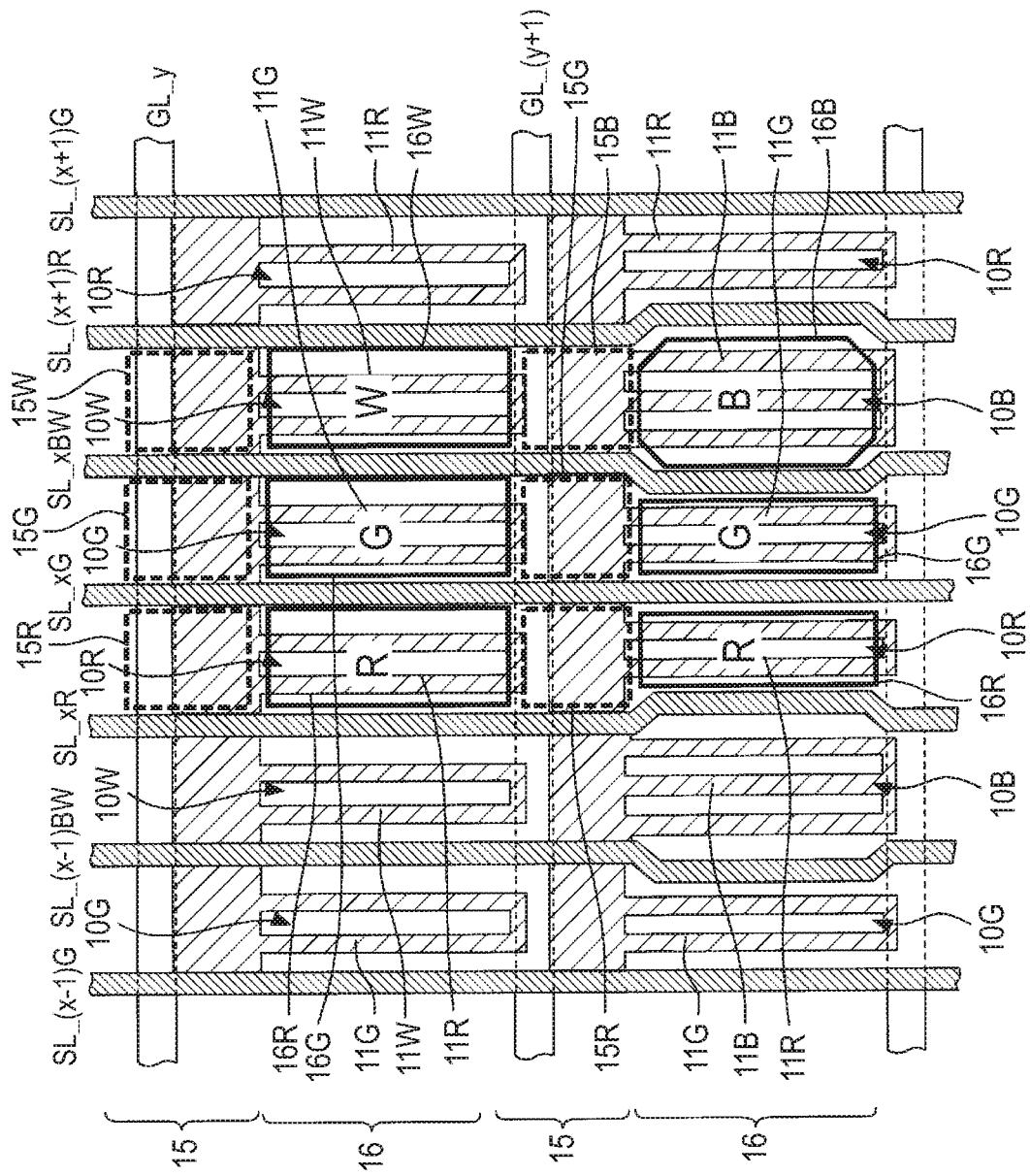
FIG. 10 is an explanatory view of a specific pixel structure of a liquid crystal display device according to the second embodiment.

A specific layout is shown in FIG. 10.

FIG. 10 shows a layout example of the range shown in FIG. 9A. In the example, only the scanning lines GL_y and GL (y+1), signal lines SL_(x−1)G to SL_(x+1)G and the pixel electrodes 11 (11R, 11G, 11B and 11W) are shown.

The signal lines SL of the columns in which the B-pixels 10B and the W-pixels 10W are arranged are shown as the signal lines SL_(x−1)BW and SL_xBW.

The pixel openings 16R, 16G, 16B and 16W are clearly shown by heavy lines and the pixel circuit portions 15R, 15G, 15B and 15W are clearly shown by heavy dotted lines.

As shown in the drawing, in the row where the R-pixel 10R, the G-pixel 10G and the W-pixel 10W are aligned, the pixel openings 16R, 16G and 16W have the same area. On the other hand, in the row where the R-pixel 10R, the G-pixel 10G and the B-pixel 10B are aligned, the pixel opening 16B of the B-pixel 10B has a larger area and the pixel openings 16R and 16G have a narrower area.

The pixel circuit portions 15 of all pixels have the same area and arranged at equal pitches.

In order to realize the above arrangement, part of signal lines SL is bent.

That is, in the range shown in FIG. 10, the signal lines SL_(x−1)G, SL_xG and SL_(x+1)G with respect to the G-pixels 10G are straight signal lines which are not bent.

On the other hand, the signal lines SL_(x−1)BW and SL_xBW with respect to the B-pixels 10B and the W-pixel 10W are bent so as to extend the left side of the pixel openings 16B only at portions adjacent to the pixel openings 16B of the B-pixels 10B. The signal lines are not bent as portions adjacent to the pixel openings 16W of the W-pixels 10W.

The signal lines SL_xR and SL_(x+1)R with respect to the R-pixels 10R are bent so as to extend the right side of the pixel openings 16B only at portions adjacent to the pixel openings 16B of the B-pixels 10B. The signal lines are not bent at portions adjacent to the pixel openings 16W of the W-pixels 10W.

All signal lines SL are arranged at equal intervals when attention is paid to portions of the pixel circuit portions 15.

As part of the signal lines SL is bent so as to extend the area of the pixel openings 16B of the B-pixels 10B as described above, the pixel openings 16B are deformed as compared with the pixel openings 16R, 16G and 16W, and yet, the pixel circuit portions 15R, 15G, 15B and 15W are arranged with the same area at equal pitches.

4. Pixel Structure of Third Embodiment

A third embodiment will be explained. The third embodiment also indicates the case where pixels of four colors R, G, B and W are included. FIG. 11B shows an example in which respective pixels 10 arranged in matrix as shown in FIG. 1 include W-pixels 10W, however, the example has a configuration in which the B-pixels 10B and the W-pixels 10W are arranged not particularly being thinned out.

That is, the R-pixels 10R, the G-pixels 10G, the B-pixels 10B and the W-pixels 10W are arranged so as to be aligned in the column direction (vertical direction) respectively.

A portion surrounded by dotted lines of FIG. 11B is enlarged to be shown in FIG. 11A.

All the R-pixel 10R, the G-pixel 10G, the B-pixel 10B and the W-pixel 10W include the pixel openings 16 (16R, 16G, 16B, 16W) and the pixel circuit portions 15 (15R, 15G, 15B and 15W).

In this case, for example, the pixel openings 16B of the B-pixels 10B are deformed so as to have a larger area than areas of the pixel openings 16R, 16G and 16W of the R-pixels 10R, the G-pixels 10G and the W-pixels 10W as shown in the drawing.

On the other hand, concerning the pixel circuit portions 15, the pixel circuit portions 15R, 15G, 15B and 15W of respective colors are arranged at equal pitches Pg.

According to the above structure, the white balance can be obtained by deformation of the pixel openings 16B in the same manner as the case of the first embodiment, which can respond to the case of high definition.

Particularly, as the width of each sub-pixel (pixel 10) tends to be smaller when four sub-pixels are arranged, the deformation such as in the embodiment is effective in that point.

A specific pixel layout can be considered to be the same as the one explained with reference to FIG. 4. That is, it is preferable to bend the signal lines SL at portions adjacent to the pixel openings 16B of the B-pixels 10B to thereby widen the area of the pixel openings 16B.

5. Modification Examples and Application Examples

The embodiments has been explained as the above, however, the structures of the liquid crystal display device are examples as well as the structures of the pixel 10 are examples.

Various examples of arrangement for the R-pixel 10R, the G-pixel 10G, the B-pixel 10B and the W-pixel 10W can be considered other than the above examples.

In the case of deforming pixels of a certain color, the layout in which the signal lines SL adjacent to the pixel openings 16 of that color are bent may be applied.

In the above embodiments, the example in which the pixel openings 16B of the B-pixels 10B have a larger area has been explained, however, this is just an example. The deformation design of the pixel openings 16 can be performed in accordance with the color balance to be a target on design.

For example, it can be considered that all pixel openings 16 will have different areas in respective pixels of R, G and B or respective pixels of R, G, B and W.

The pixel openings 16 of a certain color can be narrowed, not to be wider than the pixel openings 16 of other colors.

That is, when attention is paid to the pixels 10 corresponding to at least certain one color, various examples in which the pixels opening 16 of the pixels 10 have an area from the pixel openings 16 of pixels 10 corresponding to other colors (all other colors or part of other colors) can be considered.

The structure examples in the FFS mode have been explained in the embodiments, however, the present disclosure is not limited to the FFS mode. The technology of the present disclosure can be naturally applied to the liquid crystal display device having a structure in which the liquid crystal layer 40 is sandwiched between pixel electrodes and a counter electrode.

The present disclosure can be widely applied to a plasma display device, an organic EL display device and the like, not limited to the liquid crystal display device.

Next, application examples of the liquid crystal display device explained in the embodiments will be explained with reference to FIGS. 12A to 12C to FIGS. 14A to 14E. The liquid crystal display device according to the embodiment can be applied to electronic apparatuses in various fields displaying a video signal inputted from the outside or a video signal generated inside as images or video, which are, for example, a television apparatus, a digital camera, a notebook personal computer, portable terminal apparatuses such as a cellular phone, and a video camera.

Application Example 1

Figure 12A:
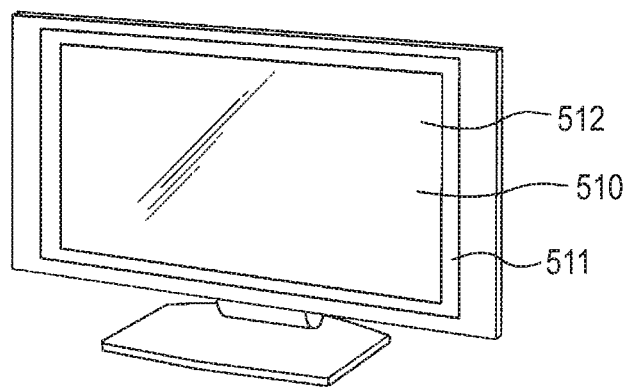
FIGS. 12A to 12C are explanatory views of electronic apparatuses as application examples according to the embodiment of the present disclosure.

FIG. 12A shows an outer appearance of a television appearance to which the liquid crystal display according to the embodiment is applied. The television apparatus has, for example, a video display screen unit 510 including a front panel 511 and a filter glass 512, and the video display screen unit 510 is formed by the liquid crystal display device according to the embodiment.

Application Example 2

Figure 12B:
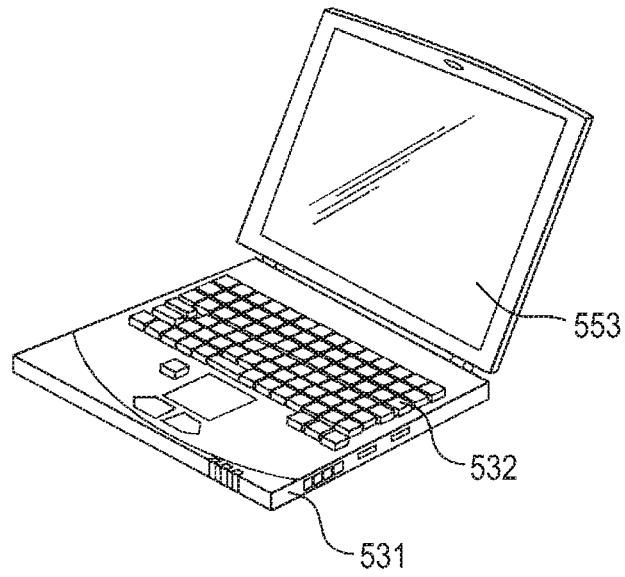

FIG. 12B shows an outer appearance of a notebook personal computer to which the liquid crystal display device according to the embodiment is applied. The notebook personal computer has, for example, a main body 531, a keyboard 532 for input operation of characters and the like, a display unit 533 displaying images and so on, in which the display unit 533 is formed by the liquid crystal display device according to the embodiment.

Application Example 3

Figure 12C:
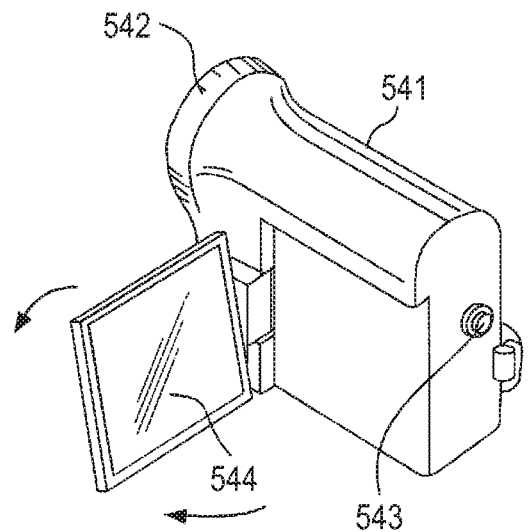

FIG. 12C shows an outer appearance of a video camera to which the liquid crystal display device according to the embodiment is applied. The video camera has, for example, a main body 541, a lens 542 for imaging objects provided on the front surface side of the main body 541, a start/stop switch 543 at the time of imaging, a display unit 544 and so on, in which the display unit 544 is formed by the liquid crystal display device according to the embodiment.

Application Example 4

Figure 13A:
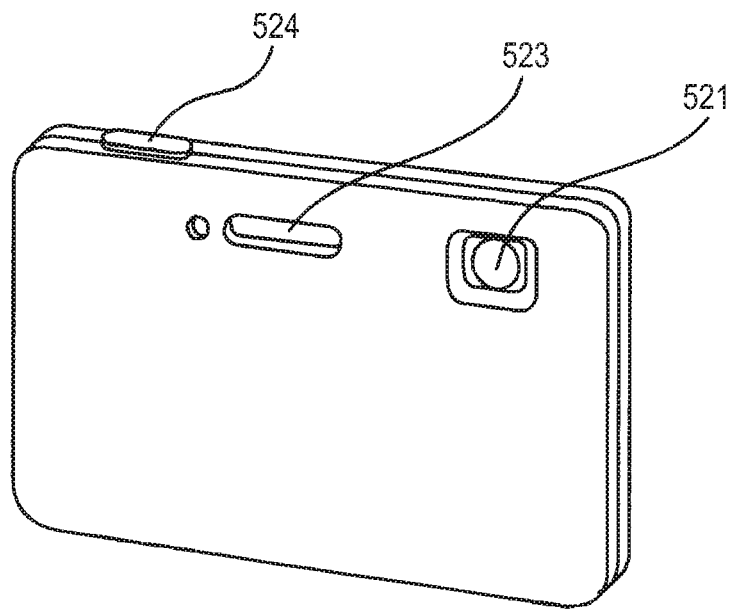
FIGS. 13A and 13B are explanatory views of an electronic apparatus as an application example according to the embodiment of the present disclosure.
Figure 13B:
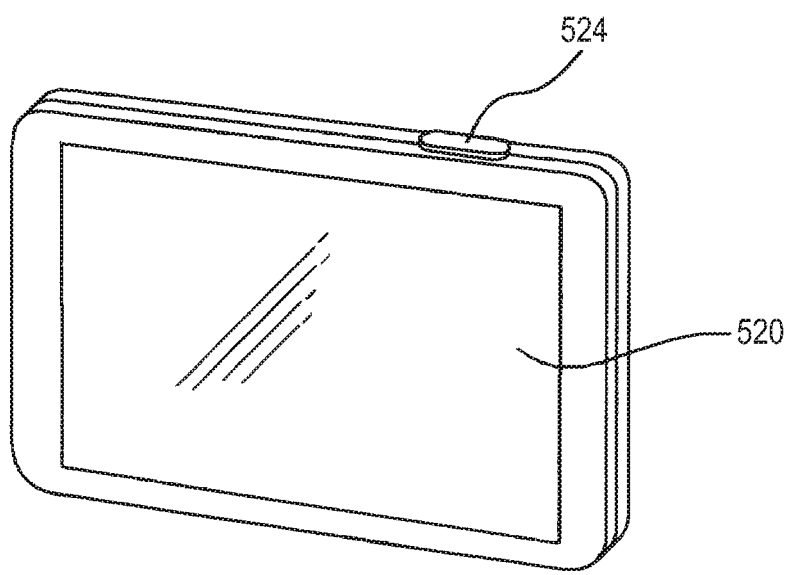

FIGS. 13A and 13B show outer appearances of a digital camera to which the liquid crystal display device according to the embodiment is applied. FIG. 13A shows an outer appearance on the front surface side and FIG. 13B shows an outer appearance on the back surface side. The digital camera has, for example, a display unit 520 with a touch panel, an imaging lens 521, a light emitting unit 523 for flash, a shutter button 524 and so on, in which the display unit 520 is formed by the liquid crystal display device according to the embodiment.

Application Example 5

Figure 14A:
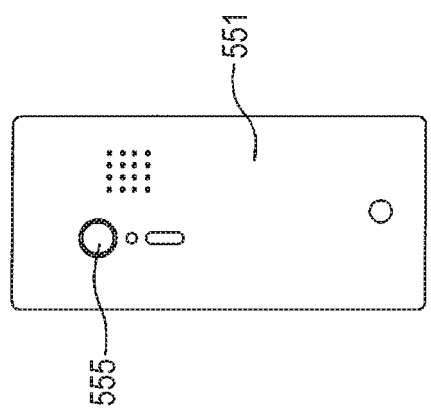
FIGS. 14A to 14E are explanatory views of an electronic apparatus as an application example according to the embodiment of the present disclosure.
Figure 14B:
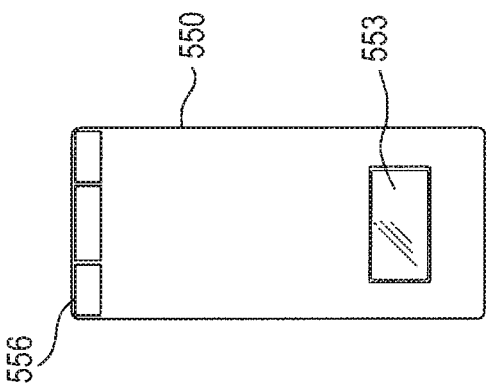
Figure 14C:
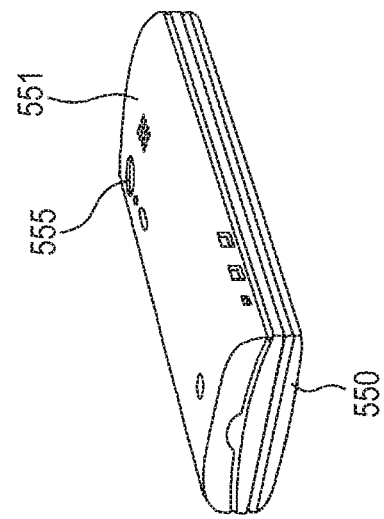
Figure 14D:
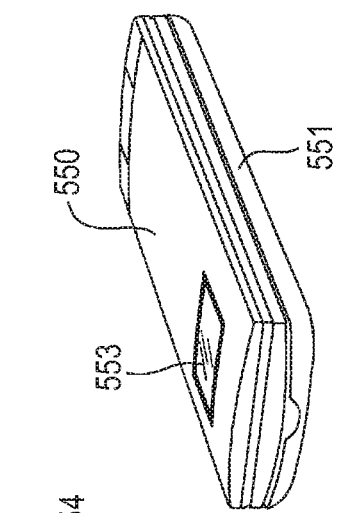
Figure 14E:
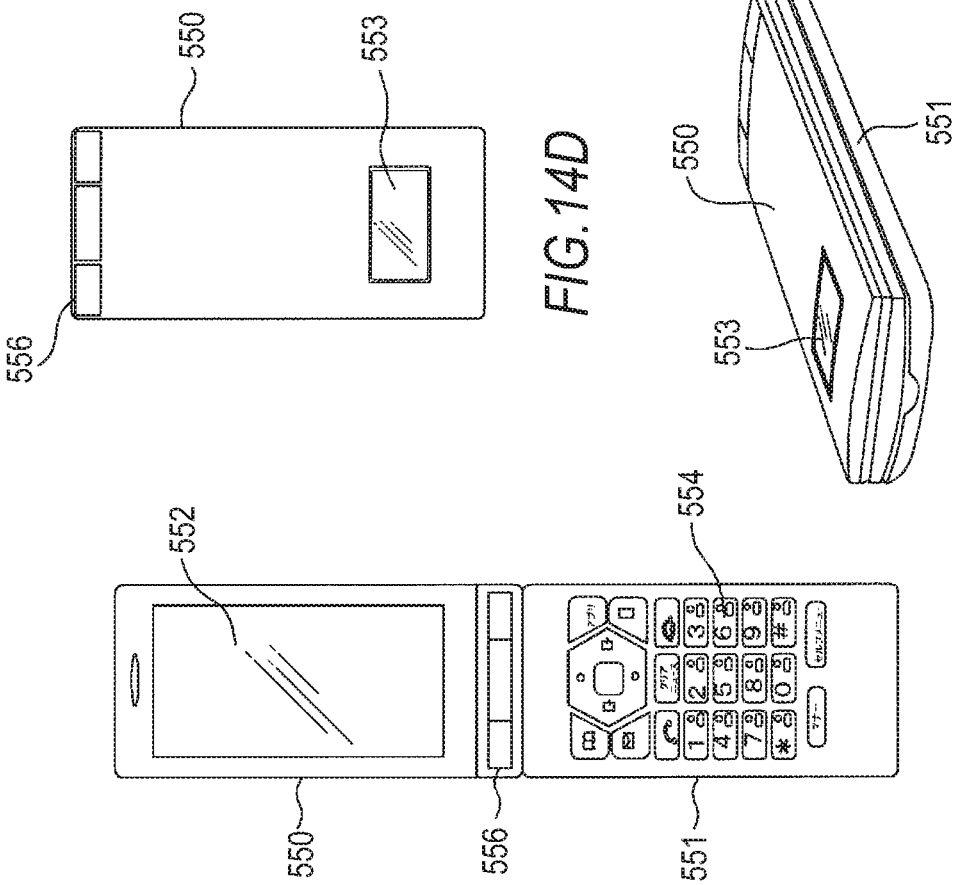

FIGS. 14A to 14E show outer appearances of a cellular phone device to which the liquid crystal display device according to the embodiment is applied. FIG. 14A shows an operation surface and a display surface in a state of opening a casing, FIG. 14B shows an upper surface side in a state of closing the casing, FIG. 14C shows a bottom surface side in the state of closing the casing. FIGS. 14D and 14E show perspective views seen from the upper surface side and the bottom surface side in the state of closing the casing.

The cellular phone device is configured by connecting an upper casing 550 to a lower casing 551 by a connection portion (hinge portion) 556, including a display 552, a sub-display 553, a key operation unit 554, a camera 555 and so on. The display 552 or the sub-display 553 is formed by the liquid crystal display device according to the embodiment.

The technology of the present disclosure can be implemented as the following configurations.

(1) A display device including
pixels corresponding to respective plural colors arranged in matrix,
in which each pixel has a pixel circuit portion in which a circuit for display driving of the pixel is arranged and a pixel opening to be an area obtaining effective display light,
the pixel openings of the pixels corresponding to at least one color have an area different from areas of the pixel openings of pixels corresponding to other colors, and
the pixel circuit portions in respective pixels are arranged at equal pitches.

(2) The display device described in the above (1), further including
plural signal lines for supplying pixel signals to respective pixels, and
plural scanning lines arranged in a direction orthogonal to the signal lines, to which a scanning pulse for controlling operations of the pixel circuit portions is given,
in which the pixel openings of the pixels corresponding to one color have an area different from areas of the pixel openings corresponding to other colors by bending at least part of the signal lines.

(3) The display device described in the above (2),
in which areas of the signal lines, the scanning lines and the pixel circuit portions are shielded from light by a shielding film with respect to a display surface plane, and the pixel openings are areas in which the shielding film is not formed.

(4) The display device described in any of the above (1) to (3), in which the pixel circuit portions of respective pixels arranged in the same row in the matrix arrangement are arranged side by side in a row direction.

(5) The display device described in any of the above (1) to (4), in which liquid crystal molecules are driven in a lateral-electric field mode, and the number of pixel electrodes arranged in the pixel openings of the pixels corresponding to one color is different from the number of pixel electrodes in the pixel openings of the pixels corresponding to other colors.

(6) The display device described in any of the above (1) to (5), in which pixels corresponding to three colors of red, green and blue or four colors of red, green, blue and white are arranged as plural colors in matrix, and the pixel openings of the pixels corresponding to blue as one color have an area larger than the pixel openings of the pixels corresponding to other colors.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
   a first substrate and a second substrate;
   a plurality of pixels corresponding to respective colors arranged in a matrix;
   wherein
   the first substrate includes, in each of the pixels, a pixel circuit portion that includes a circuit for display driving the pixels, and a color portion that includes an area capable of obtaining display light;
   the pixels at least include:
   first color pixels with a same first color arrayed in a column direction, each of the at least one first color pixels including a first circuit portion and a first color portion arranged along the column direction,
   second color pixels with a same second color arrayed in the column direction, each of the second color pixels including a second circuit portion and a second color portion arranged along the column direction;
   a third color pixel having a third circuit portion and a third color portion arranged along the column direction;
   the same first color, the same second color, and a third color of the third color pixel are different from one another,
   in a row direction, at least one of the first color pixels and at least one of the second color pixels are arranged in a same row,
   an area of the first color portion of one of the first color pixels in one row is different from an area of the first color portion of another of the first color pixels in an adjacent row to the one row, or, an area of the second color portion of one of the second color pixels in the one row is different from an area of the second color portion of another of the second color pixels in the adjacent row to the one row; and
   the first pixel circuit portion and the second pixel circuit portion are arranged in the row direction at a pitch that is equal to a pitch between adjacent pixels in the same row.

2. The display device according to claim 1, wherein each of the first color pixels, the second color pixels, and the third color pixel is one of a red pixel, a green pixel, and a blue pixel.

3. The display device according to claim 1, wherein the pixels further include a fourth color pixel having a fourth circuit portion and a fourth color portion arranged along the column direction, wherein
   in the row direction, one of the first color pixels, one of the second color pixels, and the fourth color pixel are arranged in the one row, and one of the first color pixels, one of the second color pixels, and the third color pixel are arranged in the adjacent row,
   the first pixel circuit portion, the second pixel circuit portion, and the third pixel circuit portion are arranged at the pitch, and the first pixel circuit portion, the second pixel circuit portion, and the fourth pixel circuit portion are arranged at the pitch.

4. The display device according to claim 3, wherein the fourth color pixel is a white pixel.

5. The display device according to claim 1, further comprising plural signal lines for supplying pixel signals to respective pixels; and plural scanning lines arranged in a direction intersecting the signal lines, to which a scanning pulse for controlling operations of the pixel circuit portions is provided.

6. The display device according to claim 5, wherein areas of the signal lines, the scanning lines and the pixel circuit portions are shielded from light by a shielding film with respect to a display surface plane, and the color portions are areas in which the shielding film is not formed.

7. The display device according to claim 5, further comprising pixel electrodes that are disposed in each of the pixels and are arranged in a direction crossing the signal lines.

8. The display device according to claim 5, wherein
   the signal lines include straight signal lines extending along the column direction, and signal lines having straight parts and bent parts,
   the bent parts of the signal lines are bent with an oblique angles to the straight parts.

* * * * *